(12) United States Patent
Li et al.

(10) Patent No.: US 11,792,943 B1
(45) Date of Patent: Oct. 17, 2023

(54) ANTI-LOST DEVICE

(71) Applicant: LUXSHARE PRECISION INDUSTRY COMPANY LIMITED, Shenzhen (CN)

(72) Inventors: HuaBing Li, Shenzhen (CN); Zhongyuan Lai, Shenzhen (CN); HongBing Yin, Shenzhen (CN); Lei He, Shenzhen (CN); Yu Huang, Shenzhen (CN)

(73) Assignee: LUXSHARE PRECISION INDUSTRY COMPANY LIMITED, Shenzhen (CN)

( * ) Notice: Subject to any disclaimer, the term of this patent is extended or adjusted under 35 U.S.C. 154(b) by 0 days.

(21) Appl. No.: 17/983,723

(22) Filed: Nov. 9, 2022

(30) Foreign Application Priority Data

Aug. 2, 2022 (CN) .......................... 202210921615.2

(51) Int. Cl.
*H05K 5/00* (2006.01)
*H05K 5/02* (2006.01)

(52) U.S. Cl.
CPC ......... *H05K 5/0086* (2013.01); *H05K 5/0091* (2013.01); *H05K 5/0208* (2013.01); *H05K 5/0221* (2013.01)

(58) Field of Classification Search
CPC ...................................................... H05K 5/02
See application file for complete search history.

(56) References Cited

U.S. PATENT DOCUMENTS

2009/0064921 A1* 3/2009 Palmer ................... G01D 11/26
116/305
2009/0320590 A1* 12/2009 Palmer ................... G01D 11/26
73/431

FOREIGN PATENT DOCUMENTS

| CN | 113670291 A | 11/2021 |
| CN | 214800280 U | 11/2021 |
| CN | 215281793 U | 12/2021 |

* cited by examiner

*Primary Examiner* — Jerry Wu
(74) *Attorney, Agent, or Firm* — Birch, Stewart, Kolasch & Birch, LLP (57) ABSTRACT

The present disclosure provides an anti-lost device, comprising a first casing, an electronic component, a second casing, and a metal ring. The first casing comprises a first accommodating part. The electronic component is disposed at the first accommodating part. The second casing comprises a second accommodating part corresponding to the first accommodating part. The first casing is connected to the second casing. The metal ring is interconnected between the first casing and the second casing and is disposed at an outside of the first accommodating part and the second accommodating part. The metal ring comprises an extension part extending to an outside of the first casing and the second casing. The extension part comprises a through hole. The metal ring can improve the load-bearing and tensile strength of the anti-lost device.

15 Claims, 5 Drawing Sheets

ANTI-LOST DEVICE

CROSS-REFERENCE TO RELATED APPLICATION

This application claims the priority benefit of Chinese Patent Application Serial Number 202210921615.2, filed on Aug. 2, 2022, the full disclosure of which is incorporated herein by reference.

BACKGROUND

Technical Field

The present disclosure relates to the technical field of protective casing, particularly to an anti-lost device.

Related Art

The anti-lost device contains a sensor used to prevent items from being lost or people from getting lost. For portability, anti-lost devices are normally provided with connecting components having through holes. Most of the connecting components of conventional anti-lost devices are made of plastic materials, which are poor in mechanical strength that, the through holes on the connecting components are easily broken.

SUMMARY

The embodiments of the present disclosure provide an anti-lost device tended to solve the problem of poor strength of connecting components of conventional anti-lost devices.

The present disclosure provides an anti-lost device, comprising a first casing, an electronic component, a second casing, and a metal ring. The first casing comprises a first accommodating part. The electronic component is disposed at the first accommodating part. The second casing comprises a second accommodating part corresponding to the first accommodating part. The first casing is connected to the second casing. The metal ring is interconnected between the first casing and the second casing and is disposed at an outside of the first accommodating part and the second accommodating part. The metal ring comprises an extension part extending to an outside of the first casing and the second casing. The extension part comprises a through hole.

In one embodiment, the first casing further comprises a first connecting component and a first outer part. The first connecting component is disposed at the outside of the first accommodating part. The first outer part is disposed at the outside of the first connecting component. The second casing further comprises a second connecting component and a second outer part. The second connecting component is disposed at the outside of the second accommodating part. The second outer part is disposed at the outside of the second connecting component. The second connecting component is connected to the first connecting component. The second outer part and the first outer part are disposed on two sides of the metal ring.

In one embodiment, the first outer part further comprises a plurality of securing blocks. An inner side of the metal ring comprises a plurality of securing notches. The plurality of securing notches are embedded and secured corresponding to the plurality of securing blocks.

In one embodiment, a top end of the plurality of securing blocks further comprises a securing block protrusion. The securing block protrusions of the plurality of securing blocks are pressed and secured into the plurality of securing notches.

In one embodiment, the first outer part further comprises a plurality of securing grooves extending along an outer contour of the first outer part. The plurality of securing grooves are disposed between the plurality of securing blocks.

In one embodiment, the first connecting component comprises an annular securing groove. The second connecting component comprises a securing ring. The securing ring is embedded in the annular securing groove.

In one embodiment, the second connecting component further comprises a securing sleeve. A surface of the securing ring comprises a serrated component. The securing sleeve covers the surface of the securing ring. Wherein the securing sleeve is interconnected to the securing ring and the annular securing groove.

In one embodiment, a surface of the securing sleeve is serrated. The serrated surface on the inner side of the securing sleeve is in close contact with an inner wall of the annular securing groove. The serrated surface on the outer side of the securing sleeve is in close contact with an outer wall of the annular securing groove.

In one embodiment, the first connecting component comprises a latching groove. The first accommodating part comprises a first accommodating groove. The latching groove is disposed at a groove wall of the first accommodating groove. The second connecting component comprises a latching member. The second accommodating part comprises a second accommodating groove. The latching member is disposed at the bottom of the second accommodating groove. The latching member correspondingly enters the latching groove. The latching member of the second casing is rotatably latched in the latching groove of the first casing.

In one embodiment, the latching member comprises a first wall and a second wall. The first wall extends outward from the bottom of the first accommodating groove. The second wall extends outward from a top end of the first wall. The first wall and the second wall form an L-shaped configuration. Two sides of an opening of the latching groove comprise a first groove wall and a second groove wall. The second wall is embedded into the latching groove. The second groove wall is secured in the latching member.

In one embodiment, the latching member further comprises a third wall, which closes one side of the first wall and the second wall.

In one embodiment, the first groove wall comprises a guiding side edge, along which an outer side of the second wall of the latching member is embedded into the latching groove.

In one embodiment, an inner side of the second groove wall comprises a securing side edge. The thickness of the securing side edge is increased in a direction from the outside toward the inside of the latching groove. An inner side of the second wall of the latching member is gradually pressed downward by the securing side edge to be secured.

In one embodiment, the first accommodating part comprises a first accommodating groove and a plurality of securing columns. The plurality of securing columns are disposed at the bottom of the first accommodating groove. The electronic component comprises a circuit board body provided with a plurality of securing holes. The circuit board body is disposed in the first accommodating groove. The plurality of securing columns are inserted in the plurality of securing holes of the circuit board body.

In one embodiment, a top part of the securing column is hot-melted to be secured to the circuit board body.

In one embodiment, the first accommodating part comprises a first accommodating groove and a positioning wall disposed at the bottom of the first accommodating groove. The circuit board body comprises a securing notch in which the positioning wall is disposed.

In one embodiment, the second accommodating part comprises a second accommodating groove and a pressing member disposed at the bottom of the second accommodating groove. The pressing member correspondingly presses against the electronic component.

In the embodiments of the present disclosure, by providing an anti-lost device disposed between a first casing and a second casing through a metal ring. The metal ring is secured to the first casing, and then the second accommodating part of the second casing is correspondingly assembled to the first accommodating part of the first casing. The metal ring is secured between the first casing and the second casing. The metal ring of the present disclosure could be any general metal material to be formed by metal punching and calendering. Compared with conventional plastic materials, the metal ring formed by the processes described above has better strength to satisfy requirements for load-bearing and anti-stretching. Also, the anti-lost device is produced by assembling a metal ring with plastic first casing and second casing, which could reduce the cost of the device.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
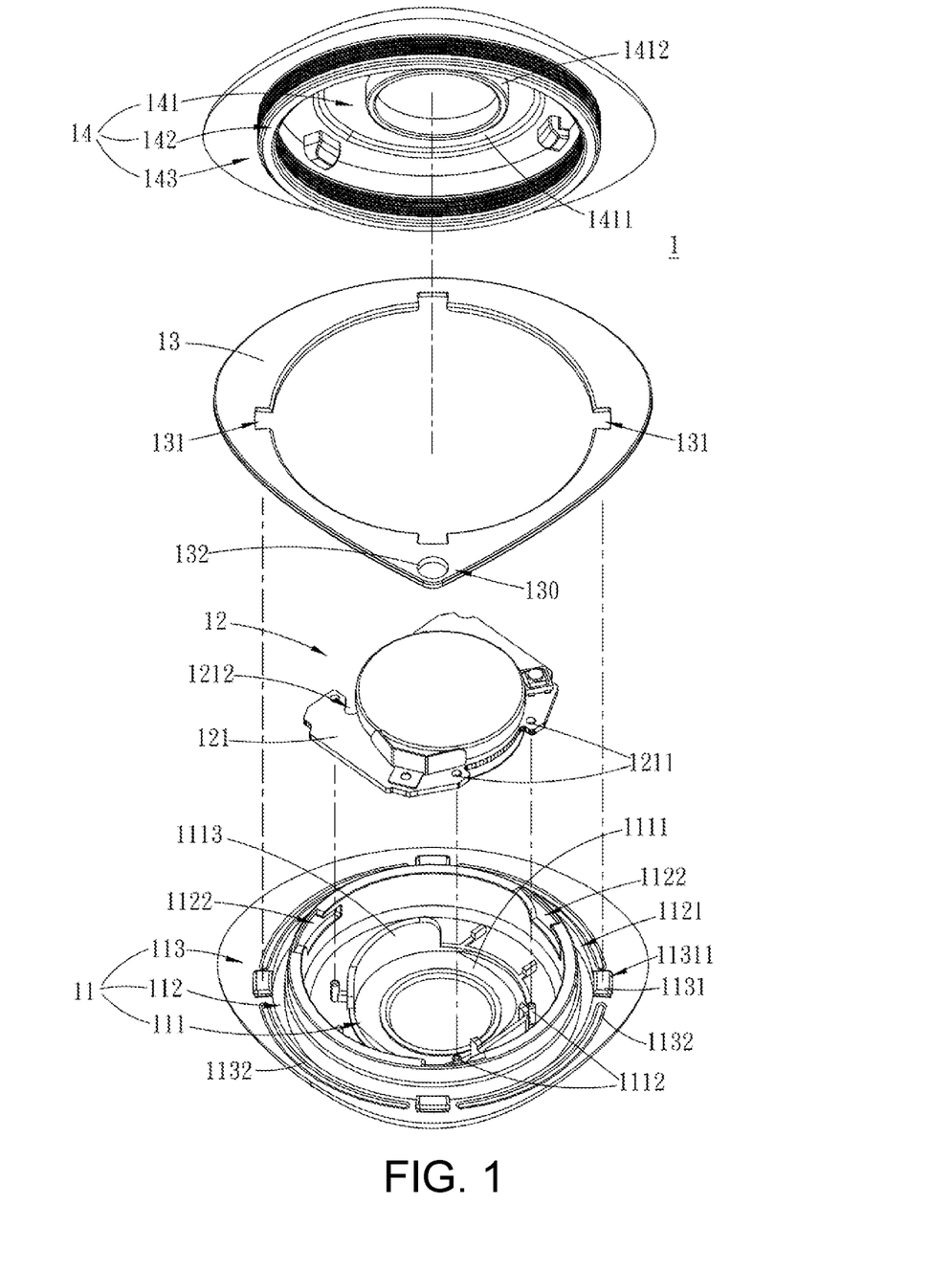
FIG. 1 is an exploded perspective view of an anti-lost device of the present disclosure.
Figure 2:
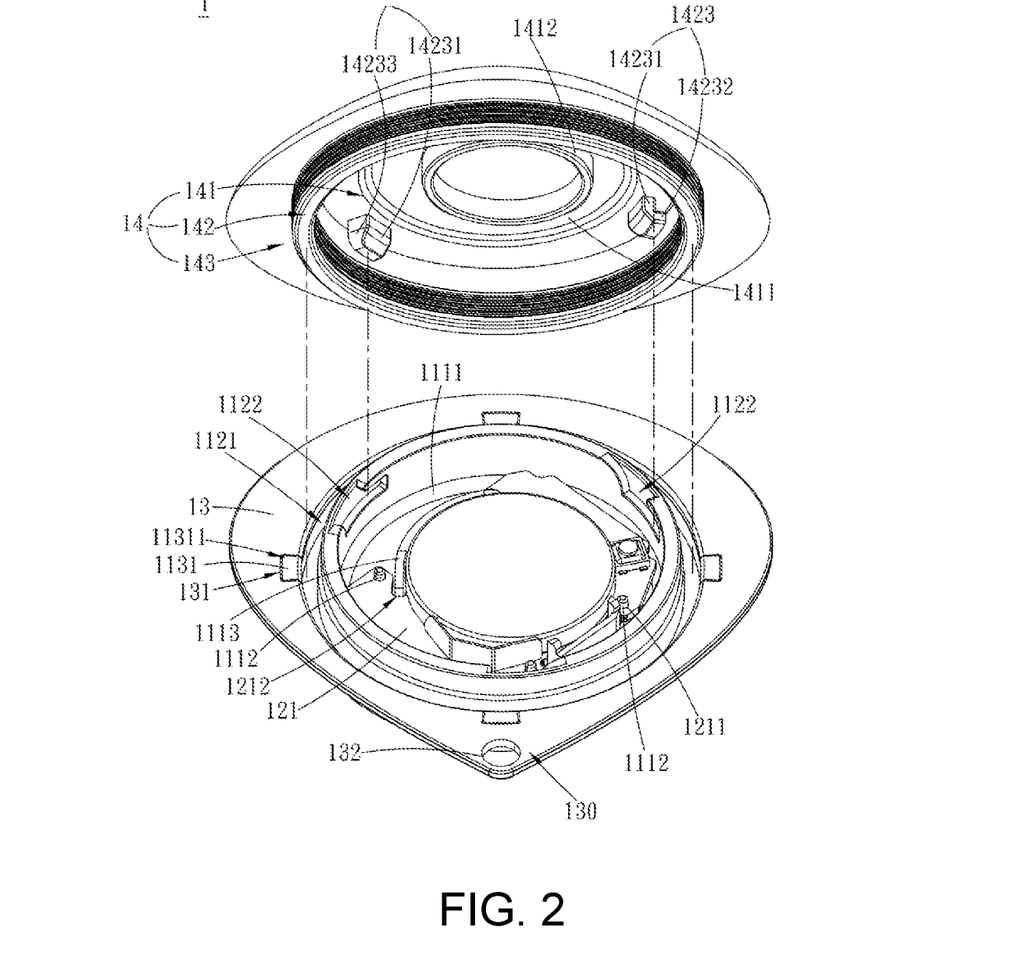
FIG. 2 is another exploded perspective view of the anti-lost device of the present disclosure.
Figure 3:
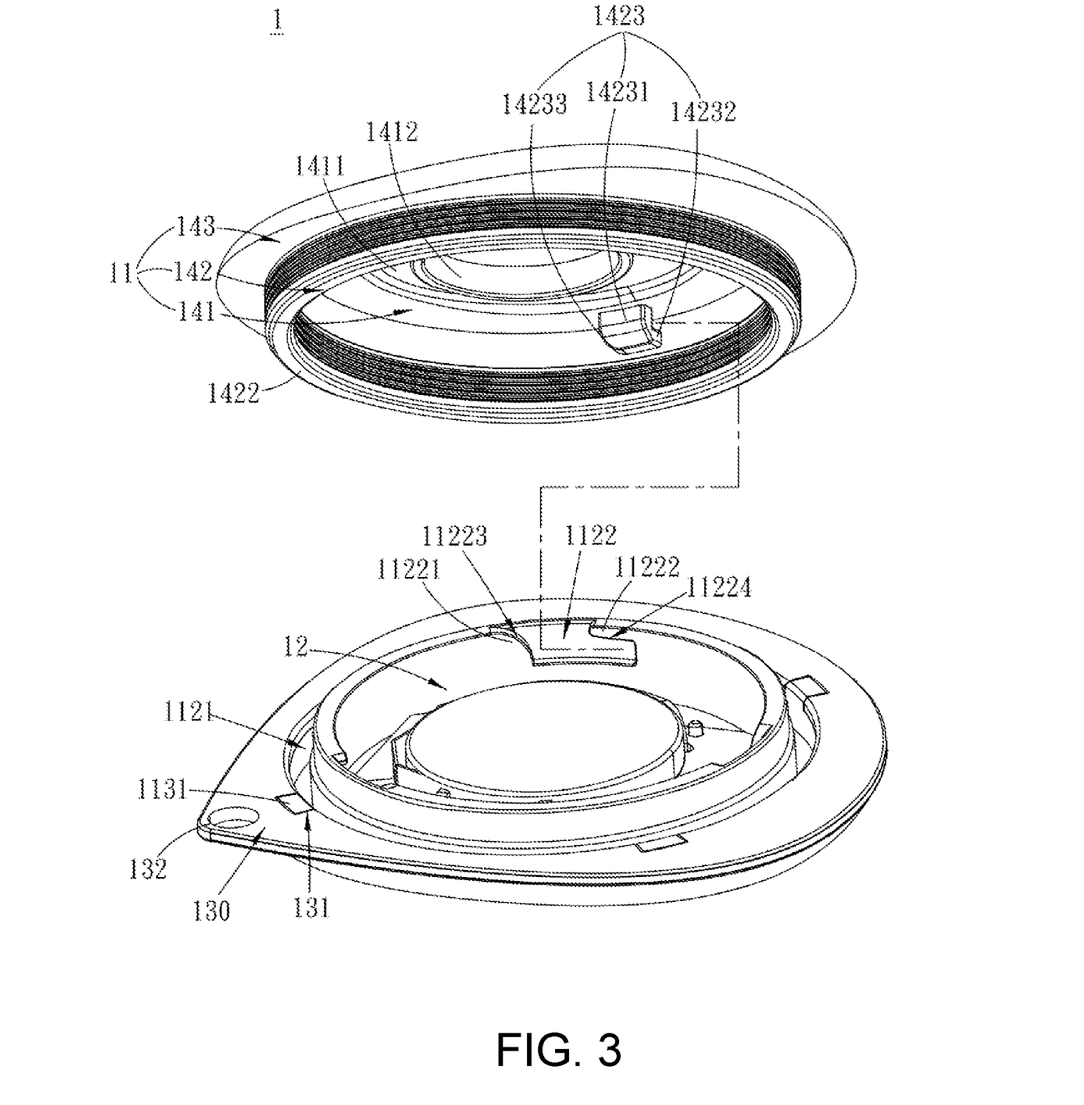
FIG. 3 is yet another exploded perspective view of the anti-lost device of the present disclosure.
Figure 4:
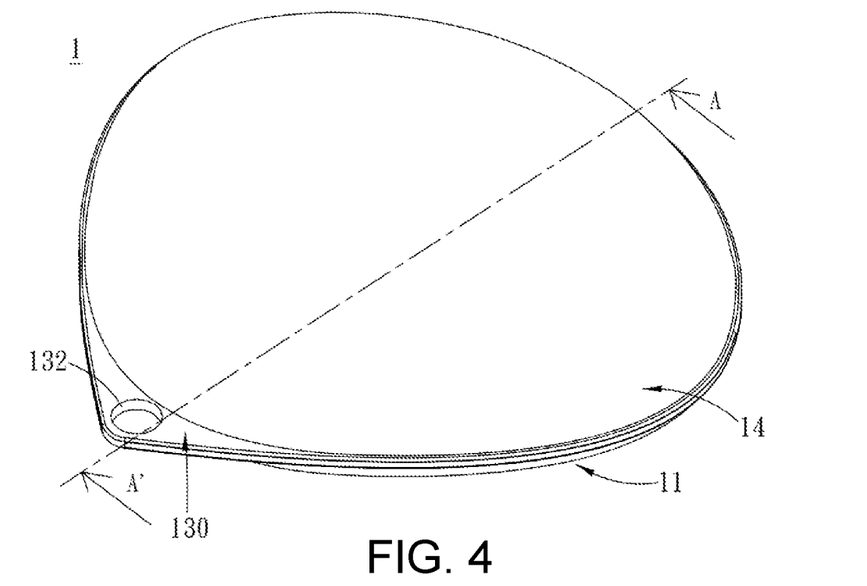
FIG. 4 is a perspective view of the anti-lost device of the present disclosure.
Figure 5:
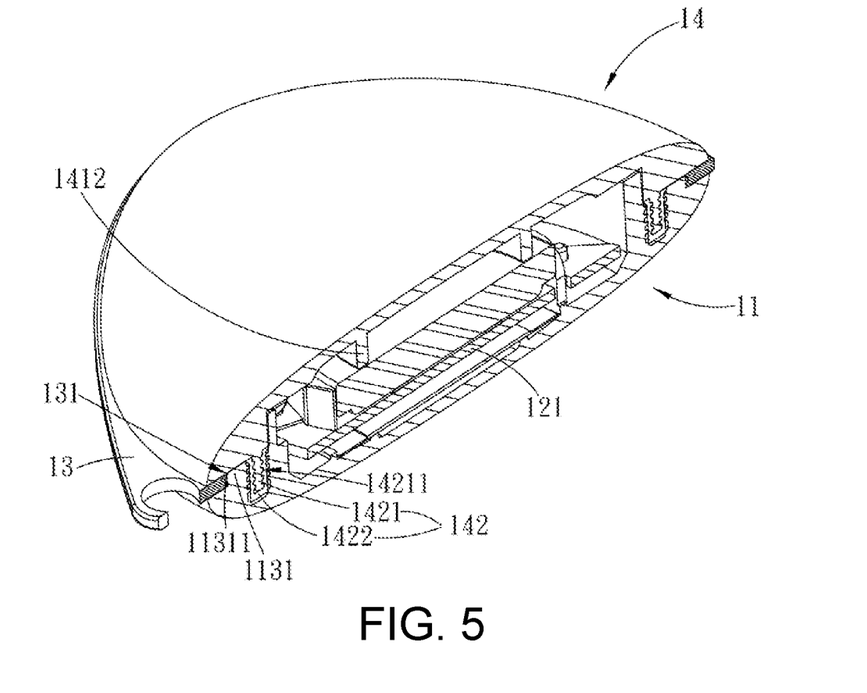
FIG. 5 is a cross-sectional perspective view along line A-A' of FIG. 4.

FIG. 1 to FIG. 3 are exploded perspective views of an anti-lost device of the present disclosure. FIG. 4 is a perspective view of the anti-lost device of the present disclosure. FIG. 5 is a cross-sectional perspective view along line A-A' of FIG. 4. As shown in the figures, the present disclosure provides an anti-lost device 1, comprising a first casing 11, an electronic component 12, a metal ring 13, and a second casing 14. The first casing 11 comprises a first accommodating part 111. The electronic component 12 is disposed in the first accommodating part 111. The second casing 14 comprises a second accommodating part 141. The second accommodating part 141 corresponds to the first accommodating part 111 each other. The first casing 11 is connected to the second casing 14. The metal ring 13 is interconnected to the first casing 11 and the second casing 14 and is disposed at an outside of the first accommodating part 111 and the second accommodating part 141. The metal ring 13 comprises an extension part 130 extended to the first casing 11 and the second casing 14. The extension part 130 comprises a through hole 132.

In this embodiment, the first casing 11 further comprises a first connecting component 112 and a first outer part 113. The first connecting component 112 is disposed at the outside of the first accommodating part 111. The first outer part 113 is disposed at the outside of the first connecting component 112. The second casing 14 further comprises a second connecting component 142 and a second outer part 143. The second connecting component 142 is disposed at the outside of the second accommodating part 141. The second outer part 143 is disposed at the outside of the second connecting component 142. The second connecting component 142 is connected to the first connecting component 112. The second outer part 143 and the first outer part 113 are disposed on two sides of the metal ring 13. Furthermore, the extending part 130 of the metal ring 13 is also disposed at the outside of the second outer part 143 and the first outer part 113. That is, the through hole 132 is also disposed at the outside of the second outer part 143 and the first outer part 113.

Figure 6:
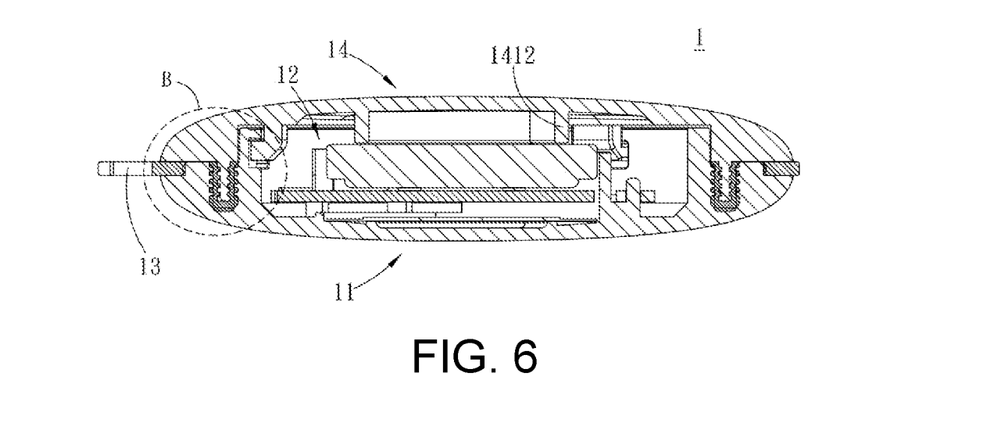
FIG. 6 is a cross-sectional view along line A-A' of FIG. 4.
Figure 7:
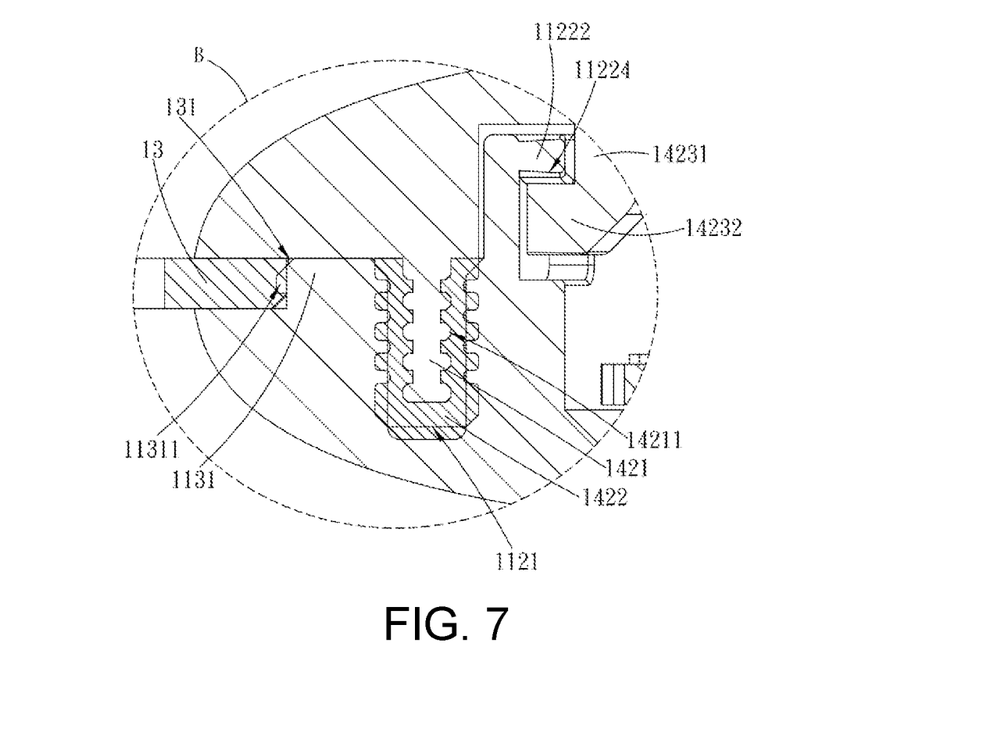
FIG. 7 is an enlarged view of area B of FIG. 6.

FIG. 6 is a cross-sectional view along line A-A' of FIG. 4. FIG. 7 is an enlarged view of area B of FIG. 6. In this embodiment, the first outer part 113 of the first casing 11 further comprises a plurality of securing blocks 1131, which are evenly distributed on the first outer part 113 of the first casing 11. The metal ring 13 is an integrally formed component made of a metal material, which is punched and calendered with a general metal material to ensure that the metal ring 13 could have sufficient tensile strength. An inner side of the metal ring 13 comprises a plurality of securing notches 131, which are embedded and secured corresponding to the plurality of securing blocks 1131. Wherein, a top end of the securing block 1131 further comprises a securing block protrusion 11311 extending outwards relative to a side edge of the securing notch 131. Since an outer diameter of the securing block protrusion 11311 is slightly greater than that of the securing notch 131, when the plurality of securing blocks 1131 are embedded into the plurality of securing notches 131, the securing block protrusions 11311 of the plurality of securing blocks 1131 would be pressed and secured in the plurality of securing notches 131 to allow the securing block protrusions 11311 and the securing notches 131 to be mutually interfered to be secured.

Moreover, the first outer part 113 of the first casing 11 comprises a plurality of securing grooves 1132, which extend along an outer contour of the first outer part 113. The plurality of securing grooves 1132 are disposed between the plurality of securing blocks 1131. The plurality of securing grooves 1132 can be used for filling with adhesive, double-sided tape, or any adhesive products, etc. Those product needs to be a fusion adhesive capable of affinity bonding with metal materials (i.e. the metal ring 13) and plastic materials (i.e. the first casing 11). When the metal ring 13 is disposed at the first outer part 113 of the first casing 11, the metal ring 13 is adhered and secured to the securing groove 1132. So, the connection strength between the metal ring 13 and the first outer part 113 of the first casing 11 can be strengthened.

Furthermore, the first accommodating part 111 of the first casing 11 comprises a first accommodating groove 1111 and a plurality of securing columns 1112. The plurality of securing columns 1112 are disposed at the bottom of the first accommodating groove 1111. The electronic component 12 comprises a circuit board body 121, which comprises a plurality of securing holes 1211. The circuit board body 121 is disposed in the first accommodating groove 1111. The plurality of securing columns 1112 are inserted in the plurality of securing holes 1211 of the circuit board body 121. Wherein, a top part of the securing column 1112 is heated, so that the top part of the securing column 1112 can be secured to the circuit board body 121. In this way, the electronic component 12 can be secured in the first accommodating groove 1111.

Besides, the first accommodating part 111 of the first casing 11 further comprises a positioning wall 1113, which is disposed at the bottom of the first accommodating groove 1111. The circuit board body 121 comprises a securing notch 1212 and is disposed in the first accommodating groove 1111. The positioning wall 1113 is disposed at an outside of the circuit board body 121 and is disposed in the securing notch 1212 of the circuit board body 121. In this way, the positioning wall 1113 could locate the position and direction of the circuit board body 121 of the electronic component 12.

In this embodiment, the first connecting component 112 of the first casing 11 comprises an annular securing groove 1121, the second connecting component 142 of the second casing 14 comprises a securing ring 1421, and the securing ring 1421 is embedded in the annular securing groove 1121. More specifically, the second connecting component 142 of the second casing 14 further comprises a securing sleeve 1422 made of waterproof silicone. An surface on an inner side and an outer side of the securing ring 1421 both comprise a serrated component 14211. The securing sleeve 1422 completely covers the surface of the securing ring 1421, so the securing sleeve 1422 also covers the serrated component 14211. In this way, the connection strength of the securing sleeve 1422 to the securing ring 1421 can be significant, and meanwhile, the surface of the securing sleeve 1422 can also be serrated-shaped.

At this time, when the securing ring 1421 is embedded into the annular securing groove 1121, the securing sleeve 1422 would be pressed into the annular securing groove 1121. That is, the securing sleeve 1422 is secured between the securing ring 1421 and the annular securing groove 1121. When the serrated surface of the securing sleeve 1422 enters the annular securing groove 1121 in an interference manner, the serrated surface of the securing sleeve 1422 is gradually deformed and closely adheres to the annular securing groove 1121. In other words, the serrated surface on the inner side of the securing sleeve 1422 is in close contact with the inner groove wall in the annular securing groove 1121, and the serrated surface on the outer side of the securing sleeve 1422 is in close contact with the outer groove wall in the annular securing groove 1121. The securing sleeve 1422 of the securing ring 1421 is embedded and secured in the annular securing groove 1121 (as shown in FIG. 7, the overlapping part of the securing sleeve 1422 and the annular securing groove 1121 is shown as an area where they mutually interfere and squeeze) to improve the waterproofing of the anti-lost device 1. Meanwhile, the frictional force between the securing sleeve 1422 and the annular securing groove 1121 can also enhance the strength of the assembling between the first casing 11 and the second casing 14.

Back to FIG. 3 again, in this embodiment, the first connecting component 112 of the first casing 11 comprises a latching groove 1122, which is disposed at a groove wall of the first accommodating groove 1111. The second connecting component 142 of the second casing 14 comprises a latching member 1423, which is disposed at the bottom of the second accommodating groove 1411. When the latching member 1423 of the second casing 14 enters the latching groove 1122 of the first casing 11 correspondingly, the second casing 14 would rotate relative to the first casing 11, so that the latching member 1423 of the second casing 14 would be rotatably latched in the latching groove 1122 of the first casing 11. In this way, the second casing 14 can be secured to the first casing 11. In addition, the metal ring 13 further comprises a through hole 132. The second outer part 143 of the second casing 14 and the first outer part 113 of the first casing 11 are disposed on two sides of the metal ring 13. The through hole 132 is disposed at the outside of the first outer part 113 and the second outer part 143. The through hole 132 can be threaded with binding ropes or decorative lines, etc. according to requirements.

The latching groove 1122 is a component at the groove wall of the first accommodating groove 1111. Two sides of an opening of the latching groove 1122 comprise a first groove wall 11221 and a second groove wall 11222. The groove direction of the latching groove 1122 extends along one side of the latching groove 1122. The latching member 1423 comprises a first wall 14231 and a second wall 14232. The second wall 14232 extends outward from a top end of the first wall 14231. The first wall 14231 and the second wall 14232 form an L-shaped configuration. The latching member 1423 further comprises a third wall 14233, which closes an opening on one side of the first wall 14231 and the second wall 14232. The third wall 14233 can enhance the structural strength of the L-shaped configuration formed by the first wall 14231 and the second wall 14232.

When the second wall 14232 of the latching member 1423 enters the latching groove 1122, the latching member 1423 rotates along the groove direction of the latching groove 1122. That is, the latching member 1423 moves toward one side having the second groove wall 11222 so that the second wall 14232 of the latching member 1423 can be embedded into the latching groove 1122. The second groove wall 11222 of the latching groove 1122 is also secured in the L-shaped configuration of the latching member 1423, and the second groove wall 11222 is pressed against the third wall 14233 of the latching member 1423.

Back to FIG. 3, the first groove wall 11221 comprises a guiding side edge 11223. When the latching member 1423 enters the latching groove 1122, an outer side of the second wall 14232 of the latching member 1423 would be embedded into the latching groove 1122 along the guiding side edge 11223. Also, an inner side of the second groove wall 11222 is pressed against the second wall 14232 of the latching member 1423. The inner side of the second groove wall 11222 comprises a securing side edge 11224. The thickness of the securing side edge 11224 can be gradually increased from the outside to the inside of the latching groove 1122. When an inner side of the second wall 14232 of the latching member 1423 moves into the latching groove 1122 along the securing side edge 11224, the inner side of the second wall 14232 of the latching member 1423 would be gradually pressed downward by the securing side edge 11224. In this way, the tight fixation between the second casing 14 and the first casing 11 can be enhanced.

Back to FIG. 2, the second accommodating part 141 of the second casing 14 further comprises a pressing member 1412. The pressing member 1412 is disposed at the bottom of the second accommodating groove 1411, and presses against the electronic component 12 correspondingly. In this way, the pressing member 1412 could press and secure the electronic component 12 in the first accommodating groove 1111. Besides, an outer surface of the first casing 11 and the second casing 14 are covered with a secondary-molded soft rubber surface layer, which is helpful for anti-collision, waterproof and dustproof functions.

In summary, the embodiments of the present disclosure provide an anti-lost device disposed between a first casing and a second casing through a metal ring. The metal ring is secured to the first outer part of the first casing, and then the second connecting component of the second casing passes through the metal ring and is assembled to the first connecting component of the first casing correspondingly. The second outer part of the second casing is secured to the metal ring. The metal ring of the present disclosure could be any general metal material to be formed by metal punching and calendering. Compared with conventional plastic materials, the metal ring formed by the processes described above has better strength to satisfy requirements for load-bearing and anti-stretching. Also, the anti-lost device is produced by assembling a metal ring with plastic first casing and second casing, which could reduce the cost of the device.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. An anti-lost device, comprising: a first casing comprising a first accommodating part; an electronic component disposed at the first accommodating part; a second casing comprising a second accommodating part corresponding to the first accommodating part, the first casing being connected to the second casing; and a metal ring interconnected between the first casing and the second casing, the metal ring being disposed at an outside of the first accommodating part and the second accommodating part, the metal ring comprising an extension part extending to an outside of the first casing and the second casing when the first and second casings are assembled, the extension part comprising a through hole; and the first casing further comprises a first connecting component and a first outer part; the first connecting component is disposed at the outside of the first accommodating part; the first outer part is disposed at the outside of the first connecting component; the second casing further comprises a second connecting component and a second outer part; the second connecting component is disposed at the outside of the second accommodating part; the second outer part is disposed at the outside of the second connecting component; the second connecting component is connected to the first connecting component; the second outer part and the first outer part are disposed on two sides of the metal ring; and the first connecting component comprises a latching groove; the first accommodating part comprises a first accommodating groove; the latching groove is disposed at a groove wall of the first accommodating groove; the second connecting component comprises a latching member; the second accommodating part comprises a second accommodating groove; the latching member is disposed at the bottom of the second accommodating groove; the latching member correspondingly enters the latching groove; the latching member of the second casing is rotatably latched in the latching groove of the first casing.

2. The anti-lost device according to claim 1, wherein the first outer part further comprises a plurality of securing blocks; an inner side of the metal ring comprises a plurality of securing notches; the plurality of securing notches are embedded and secured corresponding to the plurality of securing blocks.

3. The anti-lost device according to claim 2, wherein a top end of the plurality of securing blocks further comprises a securing block protrusion; the securing block protrusions of the plurality of securing blocks are pressed and secured into the plurality of securing notches.

4. The anti-lost device according to claim 2, wherein the first outer part further comprises a plurality of securing grooves extending along an outer contour of the first outer part; the plurality of securing grooves are disposed between the plurality of securing blocks.

5. The anti-lost device according to claim 1, wherein the first connecting component comprises an annular securing groove; the second connecting component comprises a securing ring; the securing ring is embedded in the annular securing groove.

6. The anti-lost device according to claim 5, wherein the second connecting component further comprises a securing sleeve; a surface of the securing ring comprises a serrated component; the securing sleeve covers the surface of the securing ring; wherein the securing sleeve is interconnected to the securing ring and the annular securing groove.

7. The anti-lost device according to claim 6, wherein an surface of the securing sleeve is serrated; the serrated surface on the inner side of the securing sleeve is in close contact with an inner wall of the annular securing groove; the serrated surface on the outer side of the securing sleeve is in close contact with an outer wall of the annular securing groove.

8. The anti-lost device according to claim 1, wherein the latching member comprises a first wall and a second wall; the first wall extends outward from the bottom of the first accommodating groove; the second wall extends outward from a top end of the first wall; the first wall and the second wall form an L-shaped configuration; two sides of an opening of the latching groove comprise a first groove wall and a second groove wall; the second wall is embedded into the latching groove; the second groove wall is secured in the latching member.

9. The anti-lost device according to claim 8, wherein the latching member further comprises a third wall, which closes one side of the first wall and the second wall.

10. The anti-lost device according to claim 8, wherein the first groove wall comprises a guiding side edge, along which an outer side of the second wall of the latching member is embedded into the latching groove.

11. The anti-lost device according to claim 8, wherein an inner side of the second groove wall comprises a securing side edge; the thickness of the securing side edge is increased along a direction from the outside toward the inside of the latching groove; an inner side of the second wall of the latching member is gradually pressed downward by the securing side edge to be secured.

12. The anti-lost device according to claim 1, wherein the first accommodating part comprises a first accommodating groove and a plurality of securing columns; the plurality of securing columns are disposed at the bottom of the first accommodating groove; the electronic component comprises a circuit board body provided with a plurality of securing holes; the circuit board body is disposed in the first accommodating groove; the plurality of securing columns are inserted in the plurality of securing holes of the circuit board body.

13. The anti-lost device according to claim 12, wherein a top part of the securing column is hot-melted to be secured to the circuit board body.

14. The anti-lost device according to claim 12, wherein the first accommodating part comprises a first accommodating groove and a positioning wall disposed at the bottom of the first accommodating groove; the circuit board body comprises a securing notch in which the positioning wall is disposed.

15. The anti-lost device according to claim 1, wherein the second accommodating part comprises a second accommodating groove and a pressing member disposed at the bottom of the second accommodating groove; the pressing member correspondingly presses against the electronic component.

\* \* \* \* \*